United States Patent [19]

Pattantyus-Abraham et al.

[11] 4,057,754
[45] Nov. 8, 1977

[54] APPARATUS TO MEASURE THE ECCENTRICITY OF A SHAFT

[75] Inventors: Tamas I. Pattantyus-Abraham, Pittsburgh; Leonard C. Vercellotti, Oakmont; William H. South, Greenock, all of Pa.

[73] Assignee: Westinghouse Electric Corporation, Pittsburgh, Pa.

[21] Appl. No.: 684,059

[22] Filed: May 6, 1976

[51] Int. Cl.$^2$ .................................... G01R 33/12
[52] U.S. Cl. .................. 324/207; 324/61 R; 324/103 P
[58] Field of Search ............. 324/34 R, 34 E, 103 R, 324/103 P, 61 R, 34 D, 34 PS

[56] References Cited

U.S. PATENT DOCUMENTS

| | | | |
|---|---|---|---|
| 3,593,133 | 7/1971 | Wisner | 324/103 R |
| 3,665,506 | 5/1972 | Sanford | 324/103 P |
| 3,715,659 | 2/1973 | Abnett et al. | 324/34 D |
| 3,768,010 | 10/1973 | Pozzetti | 324/103 P |

FOREIGN PATENT DOCUMENTS 1,250,921  9/1967  Germany .................... 324/103 P

*Primary Examiner*—Robert J. Corcoran
*Attorney, Agent, or Firm*—M. J. Moran

[57] ABSTRACT

A transducer is utilized to convert the eccentricity of a turbine shaft into a sinusoidal electrical voltage signal having a given frequency, amplitude and a DC bias. This electrical signal is provided to a circuit which periodically measures the maximum and minimum peaks of the sinusoidal signal. The frequency at which the latter measurements occur is related to the frequency of the sinusoidal input signal. The maximum and minimum levels of magnitude are stored periodically as DC levels and subtracted from each other to determine the absolute value of eccentricity. In addition the stored minimum value is compared with the sinusoidal signal to reduce the DC bias of the sinusoidal signal to a point where the negative peaks thereof are at zero.

4 Claims, 6 Drawing Figures

APPARATUS TO MEASURE THE ECCENTRICITY OF A SHAFT

BACKGROUND OF THE INVENTION

1. Field of the Invention

The subject matter of this invention relates generally to apparatus for electrically detecting the eccentricity of a shaft and more specifically to apparatus for periodically sampling the eccentricity of a shaft which is turning at relatively low speeds to electrically determine the absolute value of eccentricity.

2. Description of the Prior Art

It is known that shafts such as steam turbine shafts have a tendency to buckle under their own weight when maintained in one angular position for a certain period of time. The buckling of the shaft tends to introduce eccentricity or wobble into the shaft when it is thereafter rotated. This means that the actual center of rotation of the shaft no longer corresponds to the geometric center of the shaft but is offset therefrom by some amount which is equal to eccentricity. A shaft which is eccentric when rotating may cause bearing damage, among other things. It is known that large shafts may be rotated in a speed range from approximately 1.5 revolutions per minute to 600 revolutions per minute during a start-up operation in which range eccentricity may be determined. Normally the shafts rotate at operational speeds of 1800 RPM or 3600 RPM to produce 60 hertz electrical power, or 1500 RPM or 3000 RPM to produce 50 hertz electrical power. However, an eccentric shaft at the previously mentioned operational speeds would tend to be destructive. One problem associated with attempting to measure eccentricity in the relatively low speed range, i.e., 1.5 RPM to 600 RPM, is the wide ratio of speeds which must be accommodated by the electronic equipment which is utilized to measure eccentricity. In the latter case, the speed ratio is 400 to 1 (600 to 1.5). Another problem is associated with utilizing electronic equipment to make measurements at the very low end of the frequency scale, i.e., 0.025 hertz (or 1.5 RPM). It would be advantageous, therefore, if an electronic eccentricity determining apparatus could be provided which would be operational and reliable over a wide range of frequencies or speeds of shaft rotation and which would also be reliably operational at the turning gear speed (1.5 RPM) of a turbine system. Some of the problems associated with the latter situations include the difficulty in coupling signals at the frequency of .025 hertz between the stages of electronic apparatus and the large amount of charging current which would be necessary for certain capacitive elements because of the wide range of the operational speed, i.e., 400 to 1.

SUMMARY OF THE INVENTION

In accordance with the invention, apparatus for determining the eccentricity of a shaft is taught. This apparatus includes a transducer for converting the eccentricity of the shaft into a sinusoidally varying electrical signal. It also includes a resettable positive peak detector and a resettable negative peak detector each of which is connected at the input thereof to the output of the transducer. After having been reset, the positive peak detector and the negative peak detector eventually provide DC output signals which are indicative of the voltage value of the positive peak of the sinusoidal wave and the negative peak of the sinusoidal wave respectively. These signals are sampled simultaneously and stored in a holding device for a period of time generally equal to or larger than the period of the sinusoidal wave. Shortly thereafter the peak detectors are reset and the peak detecting portion of the operation begins once again. Meanwhile, the stored signals are compared providing a resultant DC signal which is indicative of the difference between the positive peak voltage and the negative peak voltage. This, in turn, is indicative of the amount of shaft eccentricity as measured by the transducer.

BRIEF DESCRIPTION OF THE DRAWINGS

For a better understanding of the invention, reference may be had to the preferred embodiments exemplary of the invention shown in the accompanying drawings in which.

DESCRIPTION OF THE PREFERRED EMBODIMENT

Figure 1A:
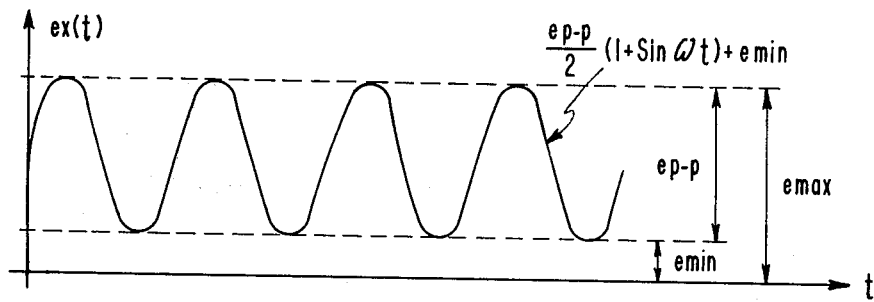
FIG. 1A shows a plot of transducer output versus time.
Figure 2:
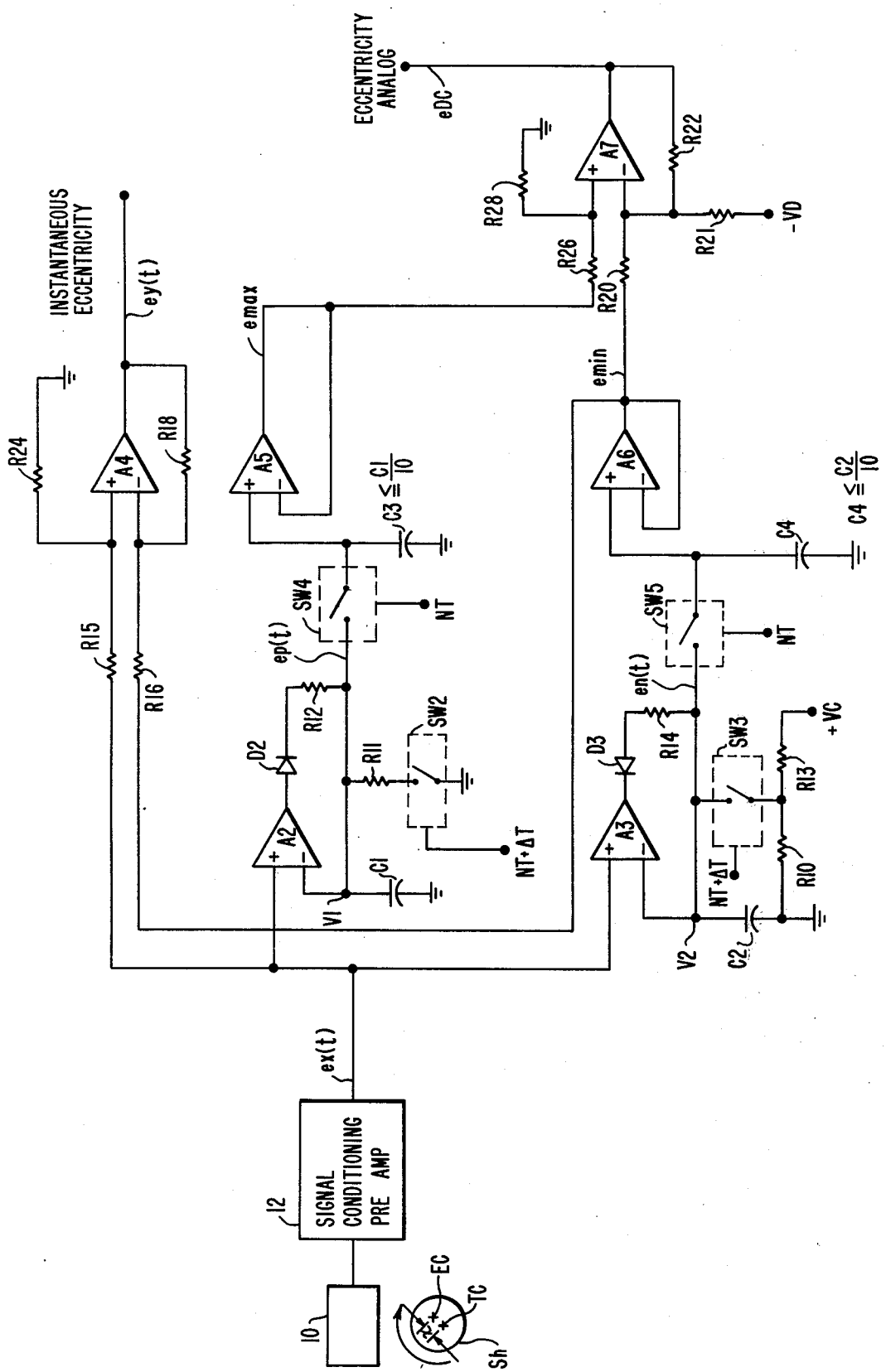
FIG. 2 shows a circuit which is partially in block diagram form for providing output signals representative of eccentricity such as are shown in FIG. 1D and FIG. 1E.

Referring now to the drawings, and to FIGS. 1A and 2 in particular, a transducer 10 is shown for measuring the eccentricity of a shaft Sh. The eccentricity of the shaft Sh is due to the fact that the shaft rotates about an eccentric center EC rather than its true center TC. The distance between the eccentric center EC and true center TC is $x$. The eccentricity of the shaft is equal to two times $x$ in this case. The transducer 10 may be a proximity transducer which converts the wobble or eccentricity of the shaft Sh into an electrical signal which is supplied to a signal conditioning preamplifier 12 such as described in U.S. Pat. No. 3,609,580 issued Sept. 28, 1971 to F. T. Thompson and B. R. Dow and assigned to the assignee of this invention. The output of the signal conditioning preamplifier 12 is the signal $ex(t)$ shown in FIG. 1A. The mathematical equation for the signal $ex(t)$ is shown below in equation 1:

$$ex(t) = (ep\text{-}p)/2\,(1 + \sin\omega t) + emin. \tag{1}$$

In the above equation, ep-p represents the amplitude of the sinusoidal signal $\sin\omega t$; emin represents the level above the zero reference axis that the negative peaks of the sine wave describe. Another quantity emax is shown in FIG. 1A which is defined as the level above the zero reference axis which the positive peaks of the sine wave describe.

Figure 1B:
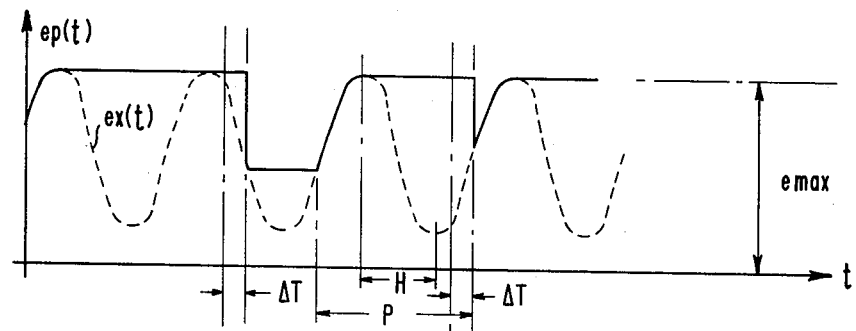
FIG. 1B shows a plot of the output of the positive peak detector versus time.
Figure 1C:
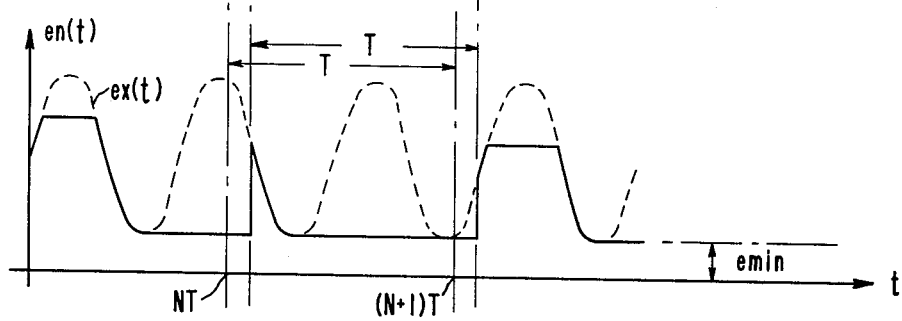
FIG. 1C shows a plot of the output of the negative peak detector versus time.
Figure 1D:
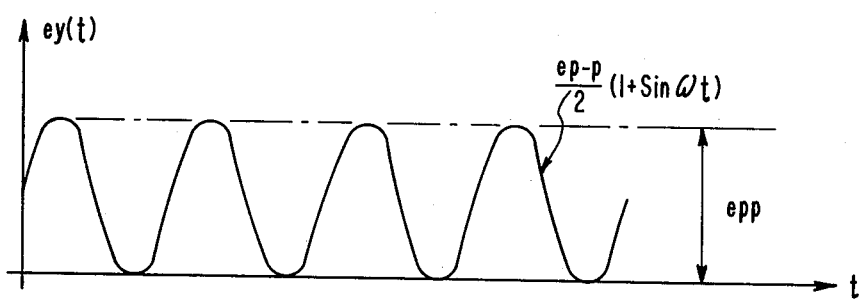
FIG. 1D shows a plot similar to that shown in FIG. 1A after the quantity "emin" has been removed.
Figure 1E:
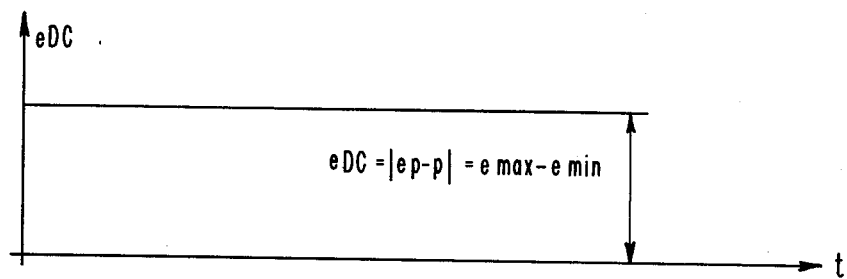
FIG. 1E shows a plot of a DC value, eDC which represents eccentricity, versus time.

Referring now specifically to FIG. 2 an electronic circuit is shown which accepts as an input the previously described signal conditioning preamplifier output signal $ex(t)$ and operates on that signal in such a manner as to provide an eccentricity analog signal eDC shown in FIG. 1E of the drawings and an instantaneous eccentricity signal $ey(t)$ shown in FIG. 1D of the drawings. The output signal $ex(t)$ is provided concurrently to one end of the resistive element R15, to the positive node of an operational amplifier A2 and to the positive node of an operational amplifier A3. The other side of the resistive element R15 is connected to the positive node of an operational amplifier A4 and to one side of another resistive element R24. The output of the operational amplifier A4 represents the instantaneous eccentricity signal $ey(t)$ shown in FIG. 1D of the drawings. In addition, the latter signal is fed back by way of resistive element R18 to the negative input node of the operational amplifier A4. The output of the operational amplifier A2 is connected to the anode of a diode D2, the cathode of which is connected to one side of a resistive element R12. The other side of the resistive element R12 is connected currently to one side of a resistive element R11, one side of a capacitive element C1, the negative terminal of the operational amplifier A2 and the input terminal of a switch SW4. The other side of the capacitive element C1 is connected to the system common or ground. The other side of the resistive element R11 is connected to the input or one terminal of the switch SW2. The other side of the switch SW4 is connected to the positive node of an operational amplifier A5 and to one side of a capacitive element C3, the other side of which is connected to the system common or ground. The other side of the switch SW2 is also connected to the system common or ground. The negative terminal of the operational amplifier A2 or the common node of the elements C1, R11, R12 and SW4 represents the terminal at which the signal $ep(t)$ shown in FIG. 1B of the drawings appears. The switch SW4 is programmed to close at a time NT, the significance of which will be described hereinafter. In a like manner the switch SW2 is programmed to close at a time $NT + \Delta T$. The output of the operational amplifier A5 is fed back to the negative terminal or node of the operational amplifier A5 and to one terminal of a resistive element R26, the other terminal of which is connected concurrently to one side of the resistive element R28 and to the positive node of an operational amplifier A7. The other side of the resistive element R28 is connected to the system common or ground. The output of the operational amplifier A5 carries the voltage level emax shown in FIGS. 1A and 1B. The output of the operational amplifier A3 is connected to the cathode of a diode D3, the anode of which is connected to one side of a resistive element R14. The other side of the resistive element R14 is connected concurrently to the negative terminal or node of the operational amplifier A3, one side of a capacitive element C2, one side or terminal or a switch SW3 and one side or terminal of a switch SW5. The other side of the capacitive element C2 is connected to system common or ground. The other side of the switching element SW3 is connected concurrently to one side of a resistive element R10 and to one side of a resistive element R13. The other side of the resistive element R13 is connected to a positive source of voltage +VC. The other side of the resistive element R10 is connected to system common or ground. The switch elements SW5 and SW3 are controlled respectively by the programming signals NT and $NT+\Delta T$ respectively, as described previously with respect to switch elements SW4 and SW2 respectively. The negative terminal of the operational amplifier A3 or the common node for the elements R14, C2, SW3 and SW5 represents the terminal at which the signal $en(t)$ shown in FIG. 1C appears. The other side of the switch element SW5 is connected concurrently to one side of a capacitive element C4 and to the positive node of an operational amplifier A6. The other side of the capacitive element C4 is connected to the system common or ground. The output of the operational amplifier A6 is connected concurrently to the negative input terminal or node of the operational amplifier A6, to one side of a resistive element R20 and to one side of a resistive element R16. The other side of the resistive element R16 is connected as an input to the negative terminal of the operational amplifier A4. The other side of the resistive element R20 is connected concurrently to the negative terminal of the operational amplifier A7, one side of a resistive element R22 and to one side of a resistive element R21. The other side of the resistive element R21 is connected to the voltage $-VD$. The other side of the resistive element R22 is connected to the output terminal of the operational amplifier A7. This latter output terminal is the terminal at which the signal eDC shown in FIG. 1E of the drawings appears. The capacitive elements C1 and C3 and the capacitive elements C2 and C4 are interrelated by the following relationships:

$$C3 \leq C1/10. \tag{2}$$
$$C4 \leq C2/10. \tag{3}$$

OPERATION OF THE ECCENTRICITY CIRCUIT

Referring now to FIGS. 1A–1E and FIG. 2, it can be seen that two kinds of output signals are provided by the signal processing electronic system. One signal (shown in FIG. 1D) portrays the real time variation of shaft eccentricity with the negative peaks of the signal being at zero voltage reference regardless of the signal amplitude, while the positive peaks provide a proportionate measure at the eccentricity in volts per inch units. Ten volts per 15 mils or less is generally regarded as an acceptable voltage analog of eccentricity. The other signal (shown in FIG. 1E) is a steady positive voltage level proportional to the peak to peak eccentricity with less than 1% ripple owing to the alternating current components in the eccentricity signal. With the present eccentricity measuring system, change in the peak to peak eccentricity signal (shown in FIG. 1E) will be shown at the appropriate output within a reasonable time after occurrence, i.e., less than three shaft rotations at low speed and less than one second at speeds greater than 90 RPM.

The sampling technique utilized with the present eccentricity sensing circuit is determined by certain constraints. As an example, the sample interval (T) must be longer than the period of the eccentricity signal. This requirement guarantees the detection of at least one positive and one negative peak of eccentricity signal between subsequent sample instants; thus, the steady levels corresponding to emax and emin are impressed across the appropriate storage capacitors C1 and C2 respectively and samples of their values are taken before resetting occurs at a time $NT+\Delta T$. By this method the ripple on the eccentricity analog signal is significantly reduced and in many instances almost completely eliminated. Following the sampling of the voltage on the capacitive elements C1 and C2 by a time $\Delta T$ the intermediate storage capacitors C1 and C2 associated with the positive and negative peak detectors are respectively charged negatively and positively in order to accommodate decreasing amplitude changes in the eccentricity signal occurring between subsequent sample pulses (i.e., resetting). Ideally the timing of the sampling pulses should be rigidly locked to a subharmonic of the shaft rotation (i.e., one sample in every second or third, etc. shaft revolution). In a simpler embodiment, however, two fixed sampling rates are used, one for speeds ranging from 1.5 RPM to approximately 90 RPM and the other in the speed range of approximately 90 RPM to 600 RPM. In both cases, the sampling interval is chosen to be longer than the longest rotational period within the particular range (i.e., T is equal to or greater than 50 seconds for the range 1.5 RPM to 90 RPM and T is equal to or greater than 1 second for the range 90 RPM to 600 RPM).

In operation of the electronic circuitry, it is necessary to register the positive and negative peaks of the output signal $ex(t)$. Next it is required to sample the voltages held in the positive and negative register and then to hold the sample signals until a next sampling instance. Next algebraic subtraction of the negative sample and hold output, namely signal emin from the positive sample and hold output, namely signal emax by the utilization of the operational amplifier A7 is accomplished. This provides the voltage signal $eDC$ shown in FIG. 1E. Concurrent with the last-named step is the generation of an instantaneous eccentricity signal shown in FIG. 1D with the signal having its negative peaks at ground or system common level. The output of the operational amplifier A4 therefore is defined by the following equation:

$$ey(t) = (ep-p)/2 \,(1 + \sin\omega t). \qquad (4)$$

Presume that the capacitive element C1 is initially discharged, switch SW2 is open and the signal at the positive node of the operational amplifier A2 is at emin as shown in FIG. 1A. Since emin is greater than zero the output of the operational amplifier A2 becomes positive, diode D2 is forwarded biased and the charging current from the operational amplifier flows into capacitive element C1 through the diode D2 and the resistive element R12. Time constant $C1 \times R12$ is chosen to be much less than the greatest rate of change of $ex(t)$; thus the voltage at the negative node of the operational amplifier A2 tracks the voltage at the positive node thereof as it changes from emin to emax. When the positive input voltage reaches emax, the voltage difference between the positive node and the negative node becomes zero. The output of the operational amplifier A2 therefore also becomes zero. Discharge of the capacitive element C1 through the resistive element R12 back into the output of the operational amplifier A2 is prevented by the reversed bias on diode D2. The output of the operational amplifier A2 will continue to be zero so long as the input signal voltage on the positive node of the operational amplifier A2 becomes more and more negative than the voltage stored in the capacitive element C1. The operation of the negative peak detector comprising the operational amplifier A3 is essentially the same as that of the positive peak detector comprising the operational amplifier A2, except that all of the polarities are reversed from those described with respect to the positive peak detector. In addition the capacitive element C2 is charged to a positive reference and discharged by the signal $ex(t)$ to the value emin. Input signal $ex(t)$ on the downward slope of that curve causes discharge of the capacitive element C2 to the value emin. It is to be noted that resistors R10-R14 are not absolutely necessary for the system. The nature of their function is mostly protective. The output of the positive peak detector is designated as $ep(t)$ and is shown in FIG. 1B of the drawings. The output of the negative peak detector is designated $en(t)$ and is shown in FIG. 1C of the drawings. There are also provided two sample and hold circuits, one of which comprises the operational amplifier A5 for the positive peak signal and the other of which comprises the operational amplifier A6 for the negative peak signal. At the sampling instance, i.e., the times NT, $(N+1)T$, etc., both of the switches SW4 and SW5 close for a short duration (typically a small fraction of the period of the highest frequency of interest) and the charge stored in the capacitive elements C1 and C2 flow through the switches SW4 and SW5 respectively as electrical current and charge the capacitive elements C3 and C4 respectively. It is to be noted that the charge is distributed between the two capacitive elements in each case, that is the charge in the capacitive element C1 is distributed between the capacitive element C1 and the capacitive element C3 and the charge in the capacitive element C2 is distributed between the capacitive element C2 and the capacitive element C4. Thus if the voltages across the capacitive elements C1 and C2 were V1 and V2 respectively, prior to the sampling instance NT, etc., the voltages V1S and V2S following the sampling instance are respectively given by the equation below:

$$V1S = V1C1/(C1 + C3). \qquad (5)$$

$$V2S = V2C2/(C2 + C4). \qquad (6)$$

In order to transfer most of the voltage V1 and most of the voltage V2 to the input nodes of the operational amplifiers A5 and A6 respectively, the capacitive elements C3 and C4 must be much smaller in capacitance than the capacitive elements C1 and C2. Thus a steady eccentricity level is properly desampled in a number of sampling periods if for example, the capacitive elements C3 and C4 are related to the capacitive elements C1 and C2 respectively by the equations below:

$$C3 = C1/10. \qquad (7)$$

$$C4 = C2/10. \qquad (8)$$

Such being the case, within two samplings, that is, the occurrence of two sampling periods, approximately 99% of the voltages V1 and V2 across the capacitive elements C1 and C2 respectively is transferred to the input of the operational amplifiers A5 and A6 respectively. The output of the two sample and hold stages, which are the outputs of the operational amplifiers A5 and A6 respectively, and which are identified by the referenced voltage values emax and emin respectively such as is shown in FIGS. 1B and 1C respectively, are applied as inputs to the algebraic subtraction stage represented by the operational amplifier A7. Signal emax is provided through the resistor combination R26 and R28 to the positive node of operational amplifier A7 while the signal emin is provided through the resistive elements R20 and R22 to the negative node of the operational amplifier A7. It is to be noted that the non-input terminal side of the resistive element R28 is grounded to provide a zero voltage reference for the positive node while the negative node of the operational amplifier A7 is connected by way of the resistive element R21 to a biasing voltage $-VD$. The output of the operational amplifier A7 is fed back through the previously described resistive element R22. The output of the operational amplifier A7 comprises the eccentricity analog signal eDC shown in FIG. 1E of the drawings. The use of the −VD input is optional; its purpose is to provide a "line zero" indication, i.e. to output a small DC voltage even when the eccentricity is zero.

The instantaneous eccentricity signal shown in FIG. 1D of the drawings, is provided at the output of the operational amplifier A4. The signal ex(t) shown in FIG. 1A of the drawings is provided by way of the resistive elements R15 and R14 to the positive node of the operational amplifier A4. The ouput of the operational amplifier A6, the signal emin shown in FIG. 1C, is provided by way of the resistive elements R16 and R18 to the negative node or terminal of the operational amplifier A4. The output of the operational amplifier A4 is fed back to the negative terminal thereof by way of resistive element R18.

The electronic circuitry and signal conditioning equipment described herein is suitable to produce two signals in response to an input, the variable component of which is the measure of eccentricity of a rotating shaft. The circuit produces a steady level in response to the input signal, the value of which is linearly proportional to the peak to peak excursions of the variable component of the input. The steady level is updated at various rates depending upon the shaft rotational speed. Another signal is produced by the circuit. The wave form of this signal is a real time facsimile of the varying component of the input signal. However, the negative peaks of the facsimile signal are maintained at ground potential regardless of the amplitude or the frequency of the input signal.

It is to be understood with respect to the embodiments of this invention that the eccentricity measurement is not limited to that of a shaft of a steam turbine but may be utilized to measure eccentricity at relatively low shaft speeds for any shaft. It is also to be understood that the transducer 10 and the signal conditioning preamplifier 12 are not limiting in that any kind of suitable eccentricity converting transducer and signal conditioning preamplifier may be utilized. The only condition is that device 12 be adjustable to produce an output the signal similar to FIG. 1A, i.e., signal must be shifted positively.

The apparatus taught with respect to the various embodiments of this invention has many advantages. One advantage lies in the fact that the utilization of operational amplifiers with capacitive elements and resistors eliminates the need for long time constant combinations, that is, changes in eccentricity are registered almost instantaneously with the occurrence thereof during the sample pulse time (NT, etc.) and then the sample values are held until the next sampling pulse at a time T later. Thus the timing of the circuit sensing rate is controlled by the sampling rate and not by long time constant circuit components as is usually the case in the prior art.

What we claim as our invention is:

1. Apparatus for determining the eccentricity of a shaft, comprising:
   a. transducer means for converting said eccentricity into a sinusoidally varying electrical signal at the output thereof, the difference between sequential positive and negative peaks of said electrical signal being indicative of said eccentricity during the interval between said positive and negative peaks;
   b. positive peak detector means, the input of which is connected to the output of said transducer means, the output of said positive peak detector means having a positive peak signal thereof which is generally indicative of said positive peak for a first predetermined period of time starting with the occurrence of said positive peak and ending with the reset of said positive peak detector means;
   c. negative peak detector means, the input of which is connected to the output of said transducer means, the output of said negative peak detector means having a negative peak signal thereof which is generally indicative of said negative peak for a second predetermined period of time starting with the occurrence of said negative peak and ending with the reset of said negative peak detector means;
   d. positive peak signal storage means, the input of which is connected to the output of said positive peak detector means for storing said positive peak signal for a storage period when said positive peak signal is transferred from said positive peak detector means to said positive peak signal storage means;
   e. negative peak signal storage means, the input of which is connected to the output of said negative peak detector means for storing said negative peak signal for said storage period when said negative peak signal is transferred from said negative peak detector means to said negative peak signal storage means;
   f. reset means interconnected with both said positive peak detector means and said negative peak detector means for generally concurrently resetting said positive peak detector means and said negative peak detector means at a reset frequency which is generally equal to or lower than the frequency of said sinusoidally varying electrical signal, the period of said resetting frequency being generally equal to said storage period;
   g. sampling means interconnected with both said positive peak detector means and said negative peak detector means for generally concurrently transferring said positive peak signal and said negative peak signal to said positive peak signal storage means and said negative peak signal storage means respectively at said reset frequency but at a predetermined increment of time prior to the application of said reset signal and during both said first and said second predetermined periods of time;
   h. adding means having one input thereof connected to the output of said positive peak signal storage means and having another input thereof connected to the output of said negative peak signal storage means, said adding means providing an output signal which is generally equal to the difference between the signal value on said one input and the signal value on said other input thus providing an indication of said eccentricity associated with said interval during a portion of the storage period immediately following said next interval; and
   i. means for comparing the stored negative peak signal with the sinusoidal signal.

2. The combination as claimed in claim 1 wherein the lower limit of reset frequency is related to the time desired to detect changes in eccentricity.

3. The combination as claimed in claim 1 wherein said reset frequency is constant over a range of frequencies for said sinusoidally varying electrical signal.

4. Apparatus for determining the eccentricity of a shaft, comprising:

a. transducer means for converting said eccentricity into a sinusoidally varying electrical signal at the output thereof, the negative peaks of said latter signal being positively biased from zero reference by a predetermined value;
b. negative peak detector means, the input of which is connected to the output of said transducer means, the output of said negative peak detector means having a negative peak signal thereof which is generally indicative of said negative peak for a predetermined period of time starting with the occurrence of said negative peak and ending with the reset of said negative peak detector means;
c. negative peak signal storage means, the input of which is connected to the output of said negative peak detector means for storing said negative peak signal for said storage period when said negative peak signal is transferred from said negative peak detector means to said negative peak signal storage means;
d. reset means interconnected with said negative peak peak detector means for resetting said negative detector means sinusoidally at a reset frequency which is generally equal to or lower than the frequency of said sinusoidally varying electrical signal, the period of said resetting frequency being generally equal to said storage period;
e. sampling means interconnected with said negative peak detector means for transferring said negative peak signal to said negative peak signal storage means at said frequency but at a predetermined increment of time prior to the application of said reset signal and during said predetermined period of time; and
f. adding means having one input thereof connected to said output of said transducer means and having another input thereof connected to the output of said negative peak signal storage means, said adding means providing an output signal which is generally equal to the difference between the signal value on said one input and the signal value on said another input thus providng as an output a signal having the same characteristic shape as said sinusoidally varying signal except that the negative peaks thereof are at said zero reference.

* * * * *